United States Patent
Cole-Yocom et al.

(10) Patent No.: US 11,908,709 B2
(45) Date of Patent: Feb. 20, 2024

(54) CONTAINER AND METHOD OF PREPARING THE SAME

(71) Applicant: FUJIFILM Electronic Materials U.S.A., Inc., North Kingstown, RI (US)

(72) Inventors: Marcia Cole-Yocom, Scottsdale, AZ (US); Bryan Hinzie, Gilbert, AZ (US)

(73) Assignee: FUJIFILM Electronic Materials U.S.A., Inc., North Kingstown, RI (US)

(*) Notice: Subject to any disclaimer, the term of this patent is extended or adjusted under 35 U.S.C. 154(b) by 537 days.

(21) Appl. No.: 16/748,826

(22) Filed: Jan. 22, 2020

(65) Prior Publication Data

US 2020/0266080 A1    Aug. 20, 2020

Related U.S. Application Data

(60) Provisional application No. 62/799,035, filed on Jan. 30, 2019.

(51) Int. Cl.
| | |
|---|---|
| *B65D 23/02* | (2006.01) |
| *H01L 21/67* | (2006.01) |
| *B65D 1/40* | (2006.01) |
| *B65D 1/42* | (2006.01) |
| *B65D 1/02* | (2006.01) |
| *B08B 3/08* | (2006.01) |
| *B08B 9/08* | (2006.01) |

(52) U.S. Cl.
CPC .......... *H01L 21/67023* (2013.01); *B08B 3/08* (2013.01); *B08B 9/08* (2013.01); *B65D 1/0215* (2013.01); *B65D 1/40* (2013.01); *B65D 1/42* (2013.01); *B65D 23/02* (2013.01)

(58) Field of Classification Search
CPC .......... B65D 1/0215; B65D 1/40; B65D 1/42; B65D 23/02; H01L 21/67023
See application file for complete search history.

(56) References Cited

U.S. PATENT DOCUMENTS

| | | | |
|---|---|---|---|
| 5,908,911 A * | 6/1999 | Nakashio | C09D 5/4453 524/904 |
| 6,329,081 B1 | 12/2001 | Fudanoki et al. | |
| 2003/0059561 A1 * | 3/2003 | Ueda | B65D 23/02 428/35.7 |
| 2005/0196629 A1 | 9/2005 | Bariatinsky et al. | |
| 2014/0221188 A1 | 8/2014 | Banda et al. | |
| 2014/0342954 A1 * | 11/2014 | Ingber | A61L 29/08 210/502.1 |

(Continued)

FOREIGN PATENT DOCUMENTS

| | | |
|---|---|---|
| WO | 2019017333 | 1/2019 |

OTHER PUBLICATIONS

"International Search Report (Form PCT/ISA/210) of PCT/US2020/014495," dated Mar. 25, 2020, pp. 1-3.

(Continued)

*Primary Examiner* — Andrew T Kirsch
(74) *Attorney, Agent, or Firm* — JCIP GLOBAL INC.

(57) ABSTRACT

A container for containing a raw material of a chemical liquid and a method of preparing a container are provided. The container at least includes an inner wall and solvent-treated surface of the inner wall. The method of preparing a container includes treating a surface of the inner wall with water and treating the surface the inner wall with an organic solvent.

18 Claims, 2 Drawing Sheets

(56) References Cited

U.S. PATENT DOCUMENTS

2015/0218407 A1* 8/2015 Bao .................. C09D 125/14
 427/388.2
2019/0025703 A1 1/2019 Shimizu et al.

OTHER PUBLICATIONS

"Written Opinion of the International Searching Authority (Form PCT/ISA/237) of PCT/US2020/014495," dated Mar. 25, 2020, pp. 1-8.

* cited by examiner

CONTAINER AND METHOD OF PREPARING THE SAME

CROSS REFERENCE TO RELATED APPLICATION

This application claims the priority benefit of U.S. provisional application Ser. No. 62/799,035, filed on Jan. 30, 2019. The entirety of the above-mentioned patent application is hereby incorporated by reference herein and made a part of specification.

BACKGROUND

1. Related Field

The present disclosure relates to a container for carrying, storing, or transporting a raw material of a chemical liquid used for the manufacturing of a semiconductor device and the like; and a method of preparing a container for carrying, storing, or transporting a raw material of a chemical liquid used for the manufacturing a semiconductor device and the like.

2. Description of the Related Art

The semiconductor industry has achieved rapid improvements in integration density of electronic components, which are derived from continuous reductions in the component size. Ultimately, more of the smaller components are afforded to be integrated into a given area. These improvements are mostly due to the development of new precision and high resolution processing techniques.

During the manufacturing of high resolution integrated circuits, various processing liquids will come into contact with a bare wafer or a film-coated wafer. For example, the fabrication of a fine metal interconnection typically involves a procedure of coating a base material with a pre-wetting liquid before the base material is coated with a composite liquid to form a resist film. These processing liquids, containing propriety ingredients and various additives, are known to be a source of contamination of IC wafer.

One can speculate that even if a trace amount of contaminants is mixed into these chemical liquids, such as a wafer pre-wetting liquid, a developer solution or rinse solution, the resulting circuit patterns may have defects. It is known that the presence of very low levels of metal impurities, as low as 1.0 ppt, interferes with the performance and stability of semiconductor devices. And depending on the kind of metallic contaminants, oxide property may deteriorate, inaccurate patterns are formed, electrical performance of semiconductor circuits is impaired, which eventually adversely impact manufacturing yields.

The contamination of impurities, such as metal impurities, coarse particles, organic impurities, moisture, and the like, may be inadvertently introduced in a chemical liquid during various stages of the manufacturing of the chemical liquid. Examples of such include a case where impurities are presented in a raw material, or originated from a container equipment, a reaction vessel, and the like used for transporting, storing, or reaction of the raw material or the chemical liquid, or a by-product generated or an unreacted reactant remained when the chemical liquid is manufactured.

Therefore, in order to form highly precise and ultra-fine semiconductor electronic circuits, chemical liquids used in the various stages of semiconductor processing, such as pre-wetting liquid, a resist solution, a developer solution, a stripping solution, a rinsing solution, and a coating solution, etc., necessitate significant quality improvement and must maintain rigorous quality control to avoid incurring defects on the resulting circuit patterns.

SUMMARY

Accordingly, to form highly precise integrated circuits, the demands for ultra-pure chemical liquids, and the quality improvement and control of theses liquids become very critical. Specific key parameters targeted for quality improvement and control include: trace-metal reduction, liquid particle count reduction, on-wafer defect reduction, organic contaminant reduction, etc. All of these key parameters are shown to be impacted by a proper design and a requisite preparation of any apparatus or vessels that may come in contact with these liquids.

In view of the above, the present disclosure is to provide particularly a container for containing a raw material of a chemical liquid for semiconductor manufacturing and a method of preparing a container, wherein a high purity chemical liquid is produced with the number of unwanted particulates and the amount of metallic impurities in the chemical liquid are managed and limited within predetermined ranges. Hence, the occurrence of residue and/or particle defects is suppressed and the yield of semiconductor wafer is improved.

In accordance with some embodiments of the present disclosure, a container for containing a raw material of a chemical liquid includes an inner wall and a solvent-treated surface that comes in contact with the raw material.

According to certain exemplary embodiments, the inner wall is constructed with a stainless steel material or coated with a resin material.

In accordance with some embodiments of the present disclosure, a method of preparing a container includes providing a container having an inner wall constructed with a stainless steel material or coated with or a resin material; treating the surface of the inner wall with water; and treating the surface of the inner wall with an organic solvent.

In accordance with some embodiments of the present disclosure, a method of preparing a container for carrying a chemical liquid includes providing a container having an inner wall with a microfinish surface; and treating a surface of the inner wall with a solvent.

According to the present disclosure, a container and a method of preparing a container are effectively designed and properly configured to obviate an introduction or generation of a wide range of organic and inorganic contaminants during the carrying, storing, or transporting of a raw material of a chemical liquid or a chemical product, hence, an ultra-high purity chemical liquid applicable in semiconductor manufacturing can be produced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
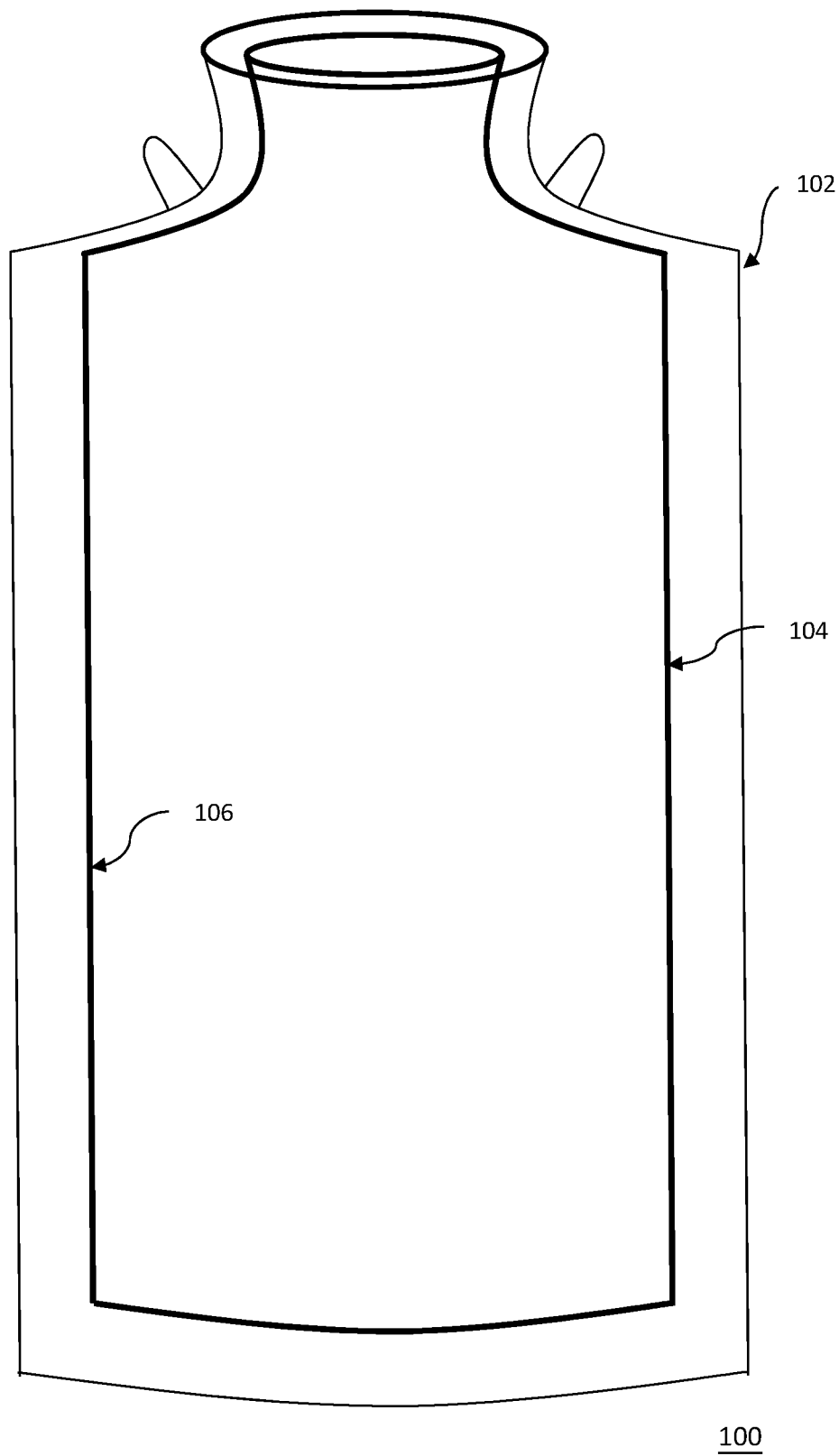
FIG. 1 is a schematic diagram showing a configuration of an exemplary container for carrying, storing, or transporting a raw material of a chemical liquid in accordance with some embodiments of the present disclosure.

The following disclosure provides different embodiments or examples, for implementing various features of the current subject matter. Specific examples of components and arrangements are described below to simplify the present disclosure. These are merely examples and are not intended to be limiting. For example, when the term "solvent(s)" is used, unless otherwise noted, it may refer to a single solvent or a combination of two or more solvents.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a numerical range indicated by using a term "to" means a range which includes numerical values described before and after the term of "to", as a lower limit value and an upper limit value.

In the present disclosure, "ppm" means "parts-per-million (10-6)", "ppb" means "parts-per-billion (10-9)" and "ppt" means "parts-per-trillion (10-12)".

In the present disclosure, 1 Å (angstrom) corresponds to 0.1 nm (nanometer) and 1 μm (micron) corresponds to 1000 nm.

<Chemical Liquid>

A chemical liquid may include a processing solution applied in semiconductor manufacturing, such as a pre-wetting liquid, a resist solution, a developer solution, a coating solution, a rinsing liquid, a cleaning solution, a stripping solution, and the like, or a chemical component applied in the synthesis of the processing solution. In the present disclosure, a chemical liquid includes an organic solvent and a predetermined amount of impurities.

<Raw Material>

Prior to being subjected to a purification process, a chemical liquid may contain an undesirable amount of impurities and contaminants. A pre-purified chemical liquid is referred herein in the present disclosure as "raw material". After the raw material is being processed by a chemical liquid manufacturing apparatus comprising at least a purification unit, substantial amounts of contaminants and impurities are removed, and a chemical liquid is produced with impurities and contaminants managed and limited within predetermined ranges. The raw material, in most embodiments of this disclosure, may be synthesized in house or commercially available via purchasing from a supplier.

<Organic Solvent>

In the present disclosure, the chemical liquid includes an organic solvent. The type of organic solvent is not particularly limited, but well-known organic solvents are applicable. The content of the organic solvent in the chemical liquid is not particularly limited, but the organic solvent is included as the main component. Specifically, the content of the organic solvent is equal to or greater than 98 mass % with respect to the total mass of the chemical liquid. In certain embodiments, the content of the organic solvent is equal to or greater than 99 mass % with respect to the total mass of the chemical liquid. In other embodiments, the content of the organic solvent is equal to or greater than 99.5 mass % with respect to the total mass of the chemical liquid. In yet other embodiments, the content of the organic solvent is equal to or greater than 99.8 mass % with respect to the total mass of the chemical liquid. The upper limit value thereof is not particularly limited, but it is in general that the upper limit value thereof is equal to or smaller than 99.999 mass %.

The organic solvent may be singly used or may be used in combination of two kinds or more thereof. In a case where a combination of two kinds or more of organic solvents is used, it is preferable that the total content thereof is in the above range.

The content of the organic solvent in the chemical liquid can be measured by using a gas chromatography (GC) device.

The boiling point of the organic solvent is not particularly limited. However, the boiling point of the organic solvent is preferably lower than 200° C. from a point of improving manufacturing yield of a semiconductor chip. In this disclosure, the boiling point means a boiling point at 1 atm.

The organic solvent is not particularly limited. Examples of the organic solvent include methanol, ethanol, 1-propanol, isopropanol, n-propanol, 2-methyl-1-propanol, n-butanol, 2-butanol, tert-butanol, 1-pentanol, 2-pentanol, 3-pentanol, n-hexanol, cyclohexanol, 2-methyl-2-butanol, 3-methyl-2-butanol, 2-methyl-1-butanol, 3-methyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2-ethyl-1-butanol, 2,2-dimethyl-3-pentanol, 2,3-dimethyl-3-pentanol, 2,4-dimethyl-3-pentanol, 4,4-dimethyl-2-pentanol, 3-ethyl-3-heptanol, 1-heptanol, 2-heptanol, 3-heptanol, 2-methyl-2-hexanol, 2-methyl-3-hexanol, 5-methyl-1-hexanol, 5-methyl-2-hexanol, 2-ethyl-1-hexanol, methyl cyclohexanol, trimethyl cyclohexanol, 4-methyl-3-heptanol, 6-methyl-2-heptanol, 1-octanol, 2-octanol, 3-octanol, 2-propyl-1-pentanol, 2,6-dimethyl-4-heptanol, 2-nonanol, 3,7-dimethyl-3-octanol, ethylene glycol, propylene glycol, diethyl ether, dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, bromomethyl methyl ether, α, α-dichloromethyl methyl ether, chloromethyl ethyl ether, 2-chloroethyl methyl ether, 2-bromoethyl methyl ether, 2,2-dichloroethyl methyl ether, 2-chloroethyl ethyl ether, 2-bromoethyl ethyl ether, (±)-1,2-dichloroethyl ethyl ether, 2,2,2-trifluoroethyl ether, ethyl vinyl ether, butyl vinyl ether, allyl ethyl ether, allyl propyl ether, allyl butyl ether, diallyl ether, 2-methoxypropene, ethyl-1-propenyl ether, cis-1-bromo-2-ethoxyethylene, 2-chloroethyl vinyl ether, allyl-1, 1,2,2-tetrafluoroethyl ether, octane, isooctane, nonane, decane, methylcyclohexane, decalin, xylene, ethylbenzene, diethylbenzene, cumene, second-butylbenzene, cymene, dipentene, methyl pyruvate, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, butyl acetate, γ-butyrolactone, isoamyl acetate, chloroform, dichloromethane, 1,4-dioxane, hexyl alcohol, 2-heptanone, isoamyl acetate, and tetrahydrofuran.

In certain embodiments of the present disclosure, the chemical liquid is a pre-wetting liquid. The type of pre-wetting liquid is not particularly limited. Specific examples of a pre-wetting liquid include at least one of cyclopentanone (CyPe), cyclohexanone (CyH), propylene glycol monomethyl ether (PGME), propylene glycol monoethyl ether (PGEE), propylene glycol monomethyl ether acetate (PGMEA), propylene glycol monopropyl ether (PGPE), ethyl lactate (EL). In other embodiments, the chemical liquid may be a developer solution such as butyl acetate, or a rinsing liquid such as 4-methyl-2-pentanol (MIBC).

<Impurities>

Impurities contained in a raw material and/or a chemical liquid include metallic impurities, particles, and others such as organic impurities, moisture, etc.

<Metallic Impurities>

The most common metallic impurities include metals such as iron (Fe), aluminum (Al), chromium (Cr), nickel (Ni) and ionic metals such as sodium (Na) and calcium (Ca). Depending on the type of metal, metal impurities deteriorate oxide integrity, degrade MOS gate stacks, reduce lifetime of devices, etc. In a chemical liquid prepared by the chemical liquid manufacturing apparatus of the present disclosure, the total trace metal content is preferred to be within a predetermined range of 0 to 150 ppt in mass.

In this disclosure, metal impurities refer to metal impurities that are provided in a form of a solid (metal simplex, particulate metal-containing compound, and the like).

In this disclosure, the total trace metal in a chemical liquid is measured by inductively coupled plasma mass spectrometry (ICP-MS) using a Fujifilm developed method.

<Particles>

In the present disclosure, the counting targets which have a size of 0.03 µm or greater are referred to as "particles". The number of "particles" in a liquid medium are to be countered by a light scattering type in-liquid particle counter and is referred as LPC (liquid particle count).

Examples of particles include dust, dirt, organic solid matters, and inorganic solid matters. The particles also may include impurities of colloidalized metal atoms. The type of the metal atoms that are easily colloidalized is not particularly limited, and may include at least one metal atom selected from the group consisting of Na, K, Ca, Fe, Cu, Mg, Mn, Li, Al, Cr, Ni, Zn, and Pb. In a chemical liquid prepared by the chemical liquid manufacturing apparatus of the present disclosure, the total content of the particles having a size of 0.03 µm or more is preferred to be within a predetermined range of 100 or less per 1 ml of the chemical liquid.

<Organic Impurities>

Organic impurities mean a compound which is different from the organic solvent as the main component provided in the chemical liquid and refer to organic matter which is contained in the content of 5000 mass ppm or smaller with respect to the total mass of the chemical liquid corresponds to the organic impurities and does not correspond to the organic solvent.

Volatile organic compounds are present in ambient air even inside a clean-room. Some of the organic impurities originate from the shipping and storage equipment, while some are presented in a raw material from the start. Other examples of organic impurities include a by-product generated when the organic solvent is synthesized and/or an unreacted reactant.

The total content of the organic impurities in the chemical liquid is not particularly limited. From a point of improving the manufacturing yield of a semiconductor device, the total content of the organic impurities is preferably 0.1 to 5000 mass ppm, more preferably 1 to 2000 mass ppm, further preferably 1 to 1000 mass ppm, particularly preferably 1 to 500 mass ppm, and most preferably 1 to 100 mass ppm, with respect to the total mass of the chemical liquid.

The content of the organic impurities in the chemical liquid can be measured by using a gas chromatography (GC) device.

In the following, the embodiments of the present disclosure describe an exemplary chemical liquid manufacturing apparatus and an exemplary manufacturing method of a chemical liquid using the same. The chemical liquid manufacturing apparatus comprises at least a plurality of material treatment systems such that the number of unwanted particulates (particles) and the amount of metallic impurities in the chemical liquid prepared using the chemical liquid manufacturing apparatus are limited within predetermined ranges. Hence, the occurrence of residue and/or particle defects is suppressed and the yield of semiconductor wafer is improved.

<Moisture (Water)>

Moisture has a destabilizing effect on the chemical and physical conditions of semiconductor surfaces. Moisture may come from the ambient air or a residue from a wet process. The moisture may be water contained inevitably in the raw material contained in the chemical liquid, or may be water inevitably contained or deliberately introduced at the time of manufacturing the chemical liquid.

The content of the water in the chemical liquid is not particularly limited. Generally, the content of the water is preferably equal to or smaller than 1.0 mass %, more preferably equal to or smaller than 0.05 mass %, with respect to the total mass of the chemical liquid. If the content of the water in the chemical liquid is equal to or smaller than 1.0 mass %, the manufacturing yield of a semiconductor chip is more improved. A lower limit is not particularly limited, but may be about 0.01 mass % in many cases. In manufacturing, it is difficult to set the content of the water to be equal to or smaller than the above value.

The content of the water means a moisture content may be measured by using a device which uses the Karl Fischer moisture measurement method as a measurement principle.

In the following, the embodiments of the present disclosure describe an exemplary container for carrying, storing, or transporting a raw material of a chemical liquid used for semiconductor manufacturing and an exemplary method of preparing the container used for the same. The container comprises at least an improved microfinish inner wall and a treated surface of the inner wall, such that any introduction of contaminants from the container is mitigated, and the number of unwanted particulates (particles) and the amount of metallic impurities in the raw material carried, stored, or transported in the container is controlled within predetermined ranges. Ultimately, the occurrence of residue and/or particle defects is suppressed when the chemical liquid is used for semiconductor manufacturing, and the yield of semiconductor wafer is improved.

<Container for Raw Material of a Chemical Liquid>

The first set of embodiments of the present disclosure relates to a container configured for carrying, storing, or transporting a raw material of a chemical liquid used for the manufacturing of a semiconductor device, wherein the raw material includes a solvent having and maintaining a content of iron (Fe) or calcium (Ca) atoms of 1 ppb or less and a content of organic impurities of 10 mass ppm or less during the course of being contained in the container. FIG. 1 is a schematic diagram showing a configuration of an exemplary container according to some embodiments of the present disclosure.

As shown in FIG. 1, a container 100 of the present disclosures includes at least a housing portion 102 configured to contain a raw material of a chemical liquid. The housing portion 102 or the entire container 100 may be constructed with a metal material or a non-metal material, including but is not limited to, stainless steel, carbon steel, ceramic, glass, or polymer resin. In certain exemplary embodiments of the present disclosure, the material of the entire container 100 or at least the housing portion 102 of the container 100 is constructed with stainless steel or carbon steel. Further, the inner wall 104 of the entire container 100 or at least the housing portion 102 of the container 100 comprises a corrosion-resistant and elution-prevention material to be described in details below.

In some embodiments, the inner wall 104 of the entire container 100 or the housing portion 102 of the container 100 is constructed with a stainless steel material or a resin material. In other embodiments, the inner wall 104 of the entire container 100 or the housing portion 102 of the container 100 is coated with a stainless steel material or a resin material to configure a lined inner wall. In still other embodiments, the entire container 100 including its inner wall 104 or at least the housing portion 102 of the container 100 including the inner wall thereof is constructed with stainless steel. In still yet other embodiments, the container 100 is constructed with carbon steel, and the inner wall 104 of the entire container 100 or at least the housing portion 102 of the container 100 is coated with a resin material.

The type of stainless steel used in forming or coating the inner wall 104 of the container 100 or forming the entire container is not particularly limited, and well-known kinds of stainless steel can be used. Among the kinds of stainless steel, an alloy which includes 8 mass % or more of nickel is preferable and austenitic stainless steel which includes 8 mass % or more of nickel is more preferable. Examples of the austenitic stainless steel include SUS (Steel Use Stainless) 304 (Ni content of 8 mass % and Cr content of 18 mass %), SUS304L (Ni content of 9 mass % and Cr content of 18 mass %), SUS316 (Ni content of 10 mass % and Cr content of 16 mass %), and SUS316L (Ni content of 12 mass % and Cr content of 16 mass %), and the like. The Ni content and Cr content in the parentheses are content rations with respect to the total mass of the metal material. Further, the stainless steel used in forming or coating the inner wall 104 of the container 100 in the present disclosure has a microfinish surface.

Regarding the conditions of the stainless steel, the arithmetic average roughness Ra denoting the surface smoothness of the stainless steel is about 0.5 µm or less. For example, the stainless steel applied in configuring or coating the inner wall 104 of the container 100 of the present disclosure has been subjected to at least cold rolled, heat treated, pickled and/or skin passed to attain a 2B surface finish (according to the material standard EN 10088-2 for stainless steel sheet) or higher and to produce an ameliorated microfinish surface such that embedded particles and inclusions of unwanted foreign matters near the surface of the stainless steel are removed. In some embodiments, the Ra of the stainless steel ranges from 0.5 µm to 0.3 µm. In yet other embodiments, the Ra of the stainless steel is 0.3 µm or less, for example, 0.2 µm or 0.1 µm.

In the present disclosure, the container 100 also may include an inner wall 104 that is either constructed or coated with a resin material. In certain embodiments, the resin material includes, but is not limited to, a phenolic resin based material, containing a phenol-formaldehyde-containing compound and a phenol-formaldehyde-containing coating agent. The types of phenolic resin is not particularly limited as long as they are chemically compatible and non-reactive with the organic solvent or chemical liquid to be carried in the container, and have high tolerance to corrosion, wear, and deterioration. The types of phenolic resin can be selected from the group consisting of novolak resins and resole resins. More particularly, in certain embodiments, the inner wall 104 of the entirety or at least the housing portion 102 of the container 100 is configured with a phenolic resin based material or is coated with a phenolic resin lining material. In some exemplary embodiments, the material of container 100 may include, for example, stainless steel, carbon steel, ceramics, polymer resins, glass, and the like, and a phenolic resin based material is integrally formed as the inner wall 104 of the container 100. In other exemplary embodiments, the material of the container 100 is carbon steel or stainless steel, and the inner wall of at least the housing portion 102 or the entirety of the container 100 is coated with a phenolic resin lining material. Further, the thickness of phenolic resin inner wall or the phenolic resin lining of the inner wall 104 of the container 100 is less than 200 microns, for example, between 125 and 135 microns.

In addition, according to some exemplary embodiments of the present disclosure, the surface of inner wall 104 that comes in contact with the raw material is a treated surface. For example, the inner wall 104, which is constructed with or coated with a stainless steel material or a resin material, comprises a solvent-treated surface 106. The solvent-treated surface 106 may include a water-treated surface, an organic solvent-treated surface, or a water-organic solvent-treated surface, and is configured by treating the inner wall 104 of the container 100 with a solvent. More particularly, in some embodiments, the solvent-treated surface 106 is configured by at least treating or washing the inner wall 104 of the container 100 with water, or at least treating or washing the inner wall 104 with an organic solvent. In other embodiments, the solvent-treated surface 106 is configured by at least treating or washing the inner wall 104 of the container 100 with water, followed by at least treating or washing the inner wall 104 with an organic solvent to passivate the inner wall surface.

In the present disclosure, the water used in treating the inner wall 104 or configuring the solvent-treated surface 106 of the inner wall 104 of the container 100 is deionized (DI) water, for example, high purity DI water having a resistivity up to 18 meg Ohms (18,000,000 ohms). In some exemplary embodiments, the organic solvent used in treating the inner wall 104 or configuring the solvent-treated surface 106 of the inner wall 104 of the container 100 includes an organic solvent which is the same organic solvent or a similar type of organic solvent to be subsequently carried in the container. Further, in certain embodiments, the organic solvent used in treating the inner wall 106 has a content of iron (Fe) or calcium (Ca) atoms of 1 ppb or less and a content of organic impurities of 10 mass ppm or less, for example.

It is noted that the above examples are for illustrative purposes, and the present disclosure is not limited to the shown examples of a container for carrying, storing, or transporting a raw material of a chemical liquid used for the manufacturing of a semiconductor device and the like. The present disclosure also may relate to a container for carrying, storing, or transporting a chemical product used for the manufacturing a semiconductor device, or a manufacturing apparatus equipped with a container, a tank, a reaction vessel and the like applied in the manufacturing a semiconductor device.

[Method of Preparing a Container]

Figure 2:
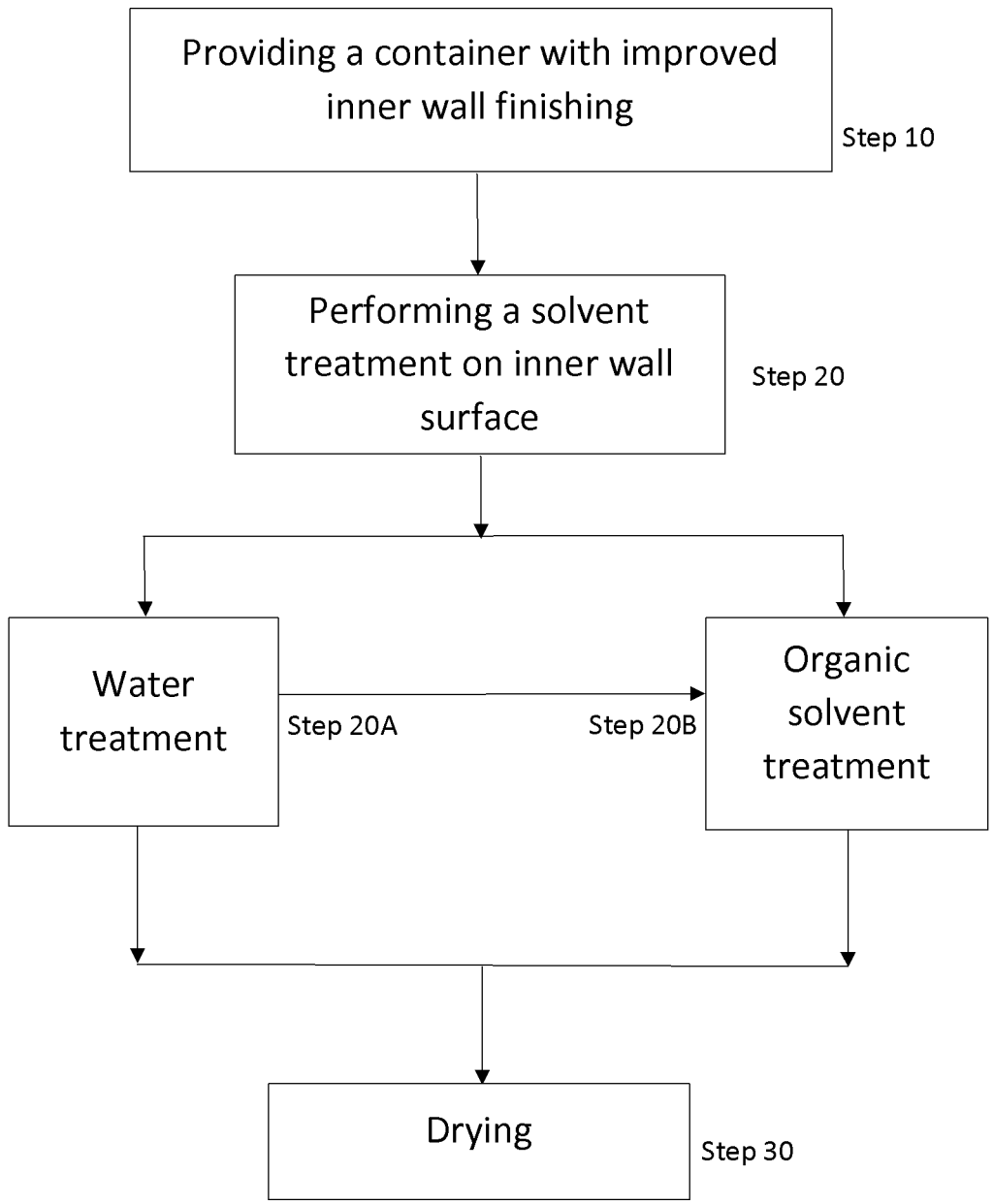
FIG. 2 is a flow chart of process steps in an exemplary manufacturing method of preparing a container for carrying, storing, or transporting a raw material of a chemical liquid in accordance with some embodiments of the present disclosure.

The second set of embodiments of the present disclosure relates to a method of preparing a container. Prior to a container being used for carrying, storing, or transporting a raw material of a chemical liquid, the container 100 is prepared or treated so that an introduction, into the raw material, of organic and inorganic contaminants eluded from or generated in the container 100 can be suppressed. FIG. 2 is a flow chart of process steps in an exemplary method of preparing a container 100 for carrying raw material of a chemical liquid in accordance with some embodiments of the present disclosure.

Referring to both FIGS. 1 and 2, a method of preparing a container, according to some embodiments, includes providing a container 100 in Step 10. The container 100 is similar to the ones described above as exemplified in paragraphs [0054] to [0064]. Briefly speaking, the material of the entire container 100 or at least the housing portion 102 of the container 100 may be constructed with a metal material or a non-metal material, for example, stainless steel, ceramic, glass, carbon steel, polymer resin, etc. In many embodiments in this disclosure, the material of the container is stainless steel or carbon steel. Further, in some embodiments, the housing portion 102 of the container 100 has an inner wall 104 that is constructed with or coated with a stainless steel material or a resin material. The stainless steel used in forming or coating the inner wall of the container in the exemplary embodiments of present disclosure has an improved microfinish surface, for example, a Ra value of stainless steel surface is about 0.5 μm or less. In other exemplary embodiments, the housing portion 102 of the container 100 has an inner wall 104 that is constructed with or coated with a resin material. The resin material used in forming or coating the inner wall of the container 100 includes, for example, a phenolic resin based material containing a phenol-formaldehyde-containing compound with a phenol-formaldehyde-containing coating agent.

Thereafter, the inner wall surface of the container 100 is treated with a solvent in Step 20. According to some embodiments, the container 100 is treated with water in Step 20A. The water used in treating the surface of the inner wall 104 of the container 100 is deionized (DI) water, for example, high purity DI water having a resistivity up to 18 meg Ohms (18,000,000 ohms). The treatment of the container 100 with water includes, for example, dousing the interior of the container 100 with water using a nozzle or a spray ball; allowing the water to remain in and inundate the inner wall 104 of the container 100 for about 12 to 48 hours, for example, 24 to 36 hours or 36 to 48 hours; and draining the water from the container 100. The water treatment Step 20A is performed at ambient temperature and the amount of water used to inundate the container 100 is the amount needed to fill 90 volume % to 100 volume % of the container 100, for example. The dousing-inundating-draining of the water treatment Step 20A is performed at least once, and may be repeated for a few more cycles, for example, one, two, three, four, five or more cycles before proceeding to drying the container 100 in Step 30.

In other examples, the treatment of the container 100 with water in Step 20A includes fully or partially filling the container 100 with water, sloshing or agitating the water in the container continuously or intermittently; allowing the water to remain in and inundate the inner wall of the container for about 12 to 48 hours, such as 24 to 36 hours or 36 to 48 hours; and draining the water from the container 100. The filling-sloshing-inundating-draining of the water treatment Step 20A is performed at least once, and may be repeated for a few more cycles, for example, one, two, three, four, five or more cycles before proceeding to the drying of the container 100 in step 30. In some embodiments, the water treatment Step 20A is concluded when the number of particles detected in the DI water treatment liquid collected at the end of a cycle of the water treatment Step 20A is controlled within a predetermined range, for example, when the number of particles having a size of 40 nm or more is 100 or less per 1 ml of the treatment liquid.

In some embodiments, the container 100 is treated with an organic solvent in Step 20B. The organic solvent used in treating the inner wall 104 of the container 100 includes, for example, the same organic solvent or a similar type of organic solvent contained in the raw material of the chemical liquid that is subsequently to be carried in the container 100. Some examples of an organic solvent used in Step 20B include, but is not limited to, cyclopentanone (CyPe), cyclohexanone (CyH), isopropanol, propylene glycol monomethyl ether (PGME), propylene glycol monoethyl ether (PGEE), propylene glycol monomethyl ether acetate (PGMEA), propylene glycol monopropyl ether (PGPE), ethyl lactate (EL). Further, the organic solvent treatment liquid applied in Step 20B has a content of iron (Fe) or calcium (Ca) atoms of 1 ppb or less and a content of organic impurities of 10 mass ppm or less.

The treatment of the container 100 with an organic solvent includes, for example, fully or partially filling the container 100 with the organic solvent, agitating or sloshing the organic solvent in the container 100 continuously or intermittently so as to enhance wetting of the container 100; allowing the organic solvent to remain in and inundate the inner wall 104 of the container 100 for a duration of about 12 to 48 hours or more, for example, 24 to 36 hours, or 36 to 48 hours or more; and draining the organic solvent from the container 100. The organic solvent treatment Step 20B is performed at ambient temperature and the amount of solvent used to fill the container 100 is, for example, the amount needed to fill 85 volume % to 100 volume % of the container 100. The filling-agitating-inundating-draining of the organic solvent treatment Step 20B of is performed at least once, and may be repeated for a few more cycles, for example, one, two, three, four, five or more cycles before proceeding to the drying of the container 100 in step 30. In some embodiments, the organic solvent treatment Step 20B is concluded when the number of particles detected in the organic solvent treatment liquid collected at the end of a cycle of the organic solvent treatment Step 20B is controlled within a predetermined range, for example, when the number of particles having a size of 40 nm or more is 100 or less per 1 ml of the treatment liquid.

In certain embodiments of the disclosure, the solvent treatment Step 20 includes a combination of water treatment Step 20A and organic solvent treatment Step 20B, wherein the organic solvent treatment Step 20B is performed after the water treatment Step 20A. More specifically, as shown in FIG. 2, after the container 100 with an improved inner wall finishing is provided in Step 10, the water treatment Step 20A is performed, followed by the organic solvent treatment Step 20B, before proceeding to the drying Step 30.

In accordance to these certain exemplary embodiments, the water treatment Step 20A may include one or more cycles of the dousing-inundating-draining or the filling-sloshing-inundating-draining using DI water, for example, high purity DI water having a resistivity up to 18 meg Ohms (18,000,000 ohms); and the organic solvent treatment Step 20B may include one or more cycles of the filling-agitating-inundating-draining using the same organic solvent or a similar type of organic solvent contained the raw material. In addition, the organic solvent treatment liquid used in Step 20B has a content of iron (Fe) or calcium (Ca) atoms of 1 ppb or less and a content of organic impurities of 10 mass ppm or less. Further, the drying of the container in Step 30 may be accomplished by, for example, air-drying, nitrogen-drying or blowing hot air into the container 100. It is noted that the sequence of the solvent treatment steps is not limited to the shown examples. In other exemplary embodiments, the organic solvent treatment Step 20B may be performed before the water treatment Step 20A.

It should be appreciated that the above examples are for illustrative purposes, and the present disclosure is not limited to the shown examples of a method of preparing a container for carrying, storing, or transporting a raw material of a chemical liquid applied in the manufacturing a semiconductor device and the like. The present disclosure may also relate to a method of preparing a container for carrying, storing, or transporting a chemical product applied in the manufacturing of a semiconductor device and the like, or a method of preparing a manufacturing apparatus equipped with a container, a tank, a reaction vessel and the like applied in the manufacturing a semiconductor device.

EXAMPLES

The present disclosure will be more specifically described below based on the following examples. A material, a use amount, a ratio, treatment details, treatment procedures, and the like which will be described the following examples can be appropriately changed in a range without departing from the gist of the present invention. Accordingly, the range of the present disclosure should not be interpreted restrictively by the following examples.

<Solvents Applied in Surface-Treatment>

The organic solvents used for the surface treatment of the inner wall of a container were, respectively, isopropyl alcohol (Solvent A), cyclohexanone (Solvent B), and PGMEA (Solvent C) in which all satisfied the prerequisites of having a content of iron (Fe) or calcium (Ca) atoms of 1 ppb or less and a content of organic impurities of 10 mass ppm or less. Alternatively speaking, the organic solvents applied in the surface treatment process were good purity grade products having limited amounts of metal, organic, and/or other types of impurities. The water used for the surface treatment of the inner wall was DI water having a resistivity up to 18 meg Ohms.

<Trace Metal (ppb)>

Each treatment liquid sample was tested using ICP-MS (inductively coupled plasma mass spectrometry (ICP-MS). Using a Fujifilm developed method, each sample was tested for the presence of 26 metal species, the detection limit was metal specific, but the typical detection limits were in the range of 0.00010-0.030 ppb.

<Evaluation Results>

The effects of solvent treatment were examined, and the results were summarized in Tables 1-3 below.

To obtain the samples in Tables 1 and 2, water treatment (the dousing-inundating-draining treatment) was first performed on an inner wall of a stainless container. After the water treatment was completed, a first treatment liquid sample, namely a sample of the DI water used in the water treatment process, was collected and tested for trace metals. Thereafter, an organic solvent treatment (filling-agitating-inundating-draining treatment) was performed on the water-treated inner wall to passivate the inner wall of the container. After the organic solvent treatment was completed, a second treatment liquid sample, namely a sample of the organic solvent used in the organic solvent treatment process, was collected and tested for trace metals.

For the samples in Table 3, one cycle of water treatment was first performed on an inner wall of a stainless steel container. Thereafter, two cycles of organic solvent treatment were performed on the water-treated inner wall, wherein after each of the two cycles of the organic solvent treatment, samples, namely a first treatment liquid sample and a second treatment liquid sample, were respectively collected and tested for trace metals.

TABLE 1

| Metal Elements | Water Treatment (First treatment liquid sample) | Organic Solvent A Treatment after Water Treatment (Second treatment liquid sample) |
|---|---|---|
| Cr (chromium) | 0.57 | 0.04 |
| Cu (copper) | 0.53 | 0.08 |
| Fe (iron) | 2.45 | 0.33 |
| Mn (manganese) | 0.07 | 0.01 |
| Ni (nickel) | 0.14 | 0.03 |
| Na (sodium) | 8.28 | 1.46 |

TABLE 2

| Metal Elements | Water Treatment (First treatment liquid sample) | Organic Solvent B Treatment after Water Treatment (Second treatment liquid sample) |
|---|---|---|
| Na (sodium) | 2.5 | 0.23 |

TABLE 3

| Metal Elements | Organic Solvent C Treatment after Water Treatment (First treatment liquid sample) | Organic Solvent C Treatment after First Cycle of Organic Solvent C Treatment (Second treatment liquid sample) |
|---|---|---|
| Ca (calcium) | 0.079 | 0.003 |
| Cu (copper) | 0.092 | 0.011 |
| Fe (iron) | 0.034 | 0.006 |
| Na (sodium) | 0.164 | 0.027 |

The collective results as summarized in Tables 1 to 3 confirmed that the method of preparing a container intended for carrying a raw material of a chemical liquid used for semiconductor manufacturing of the present application achieved the desirable advantages of significantly reducing the amounts of trace metals in a container. According to the results shown in Table 1, the tested trace metals were significantly reduced in the organic solvent (isopropyl alcohol), compared to those detected in the DI water. Similarly, as shown in Table 2, the amount of Na (sodium) in cyclohexanone was reduced by 10 folds, compared to the amount of Na detected in DI water treatment liquid. The results in Table 3 also demonstrated the significant reduction of trace metals after each additional treatment cycle. These data substantiated that the method of preparing a container of the present disclosure by treating the inner wall of the container with DI water having a specified resistivity followed by passivating the inner wall with an organic solvent having limited amount of metal and organic contaminants significantly reduce the amount of contaminants remaining in the container, which will impede any introduction of unwanted contaminants into the raw material of the chemical liquid to be carried by the container.

Accordingly, the container and the method of preparing a container of the present disclosure offer the competitive advantages of producing ultra-high purity chemical liquids, including but is not limited to, methanol, ethanol, 1-propanol, isopropanol, monomethyl ether, propylene glycol monomethyl ether, propylene glycol monoethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 4-methyl-2-pentanol, or a combination thereof. Further, better performance was observed when cyclohexanone, PGMEA, butyl acetate, propylene glycol monomethyl ether acetate, isopropanol was used, and even better performance was achieved when cyclohexanone was used. Ultimately, an incurrence of defects on circuit patterns and semiconductor devices is avoided, and the yield is improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A container for containing a raw material of a chemical liquid used for semiconductor manufacturing, the container comprising:
    an inner wall, constructed with a stainless steel material or coated with a resin material; and
    a solvent-treated surface of the inner wall, wherein the solvent-treated surface comes in contact with the raw material that includes a solvent having a content of iron (Fe) or calcium (Ca) atoms of 1 ppb or less and a content of organic impurities of 10 mass ppm or less during a course of being contained in the container,
    wherein the solvent-treated surface comprises a water-treated surface, which is configured by treating a surface of the inner wall with only deionized water, or
    wherein the solvent-treated surface comprises an organic solvent-treated surface, which is configured by treating a surface of the inner wall with only an organic solvent as the solvent included in the raw material, or
    wherein the solvent-treated surface comprises a water-organic solvent-treated surface, which is configured by treating a surface of the inner wall with only deionized water, followed by treating the surface of the inner wall with only an organic solvent as the solvent included in the raw material.

2. The container of claim 1, the stainless steel material used in constructing the inner wall has a 2B surface finish or higher.

3. The container of claim 2, wherein the stainless steel material has an arithmetic average roughness Ra of about 0.5 μm or less.

4. The container of claim 1, wherein the inner wall is coated with a phenolic resin lining material.

5. The container of claim 1, wherein a material of the container includes stainless steel or carbon steel.

6. A method of preparing a container for containing a raw material of a chemical liquid, the method comprising:
    providing a container having an inner wall that is constructed with a stainless steel material or coated with a resin material;
    treating a surface of the inner wall with only water; and
    treating the surface of the inner wall with only an organic solvent, wherein the organic solvent includes a solvent included in the raw material.

7. The method of claim 6, wherein the treating of the surface of the inner wall with only the water comprises:
    dousing an interior of the container with only the water;
    allowing the water to remain in the container for a first time period;
    draining the water from the container; and
    drying the container.

8. The method of claim 6, wherein the treating of the surface of the inner wall with only the organic solvent comprises:
    fully or partially filling the container with only the organic solvent;
    agitating or sloshing the organic solvent in the container;
    allowing the organic solvent to remain in the container for a second time period;
    draining the organic solvent from the container; and
    drying the container.

9. The method of claim 6, wherein the treating of the surface of the inner wall with only the organic solvent is performed after the treating of the surface of the inner wall with only the water is completed.

10. The method of claim 9, wherein the treating of the surface of the inner wall with only the water is performed at least once.

11. The method of claim 9, wherein the treating of the surface of the inner wall with only the organic solvent is performed at least once.

12. The method of claim 9, wherein a number of particles having a size of 40 nm or more is 100 or less per 1 ml of the organic solvent used in the treating of the surface of the inner wall.

13. The method of claim 6, wherein the water used in treating the surface of the inner wall is deionized water having a resistivity up to 18 meg Ohms.

14. The method of claim 6, wherein the organic solvent used in treating surface of the inner wall has a content of iron (Fe) or calcium (Ca) atoms of 1 ppb or less and a content of organic impurities of 10 mass ppm or less.

15. The method of claim 6, wherein the stainless steel material used in constructing the inner wall has a 2B surface finish or higher, and an arithmetic average roughness Ra of about 0.5 μm or less.

16. The method of claim 6, wherein the resin material used in coating the inner wall comprises a phenolic resin.

17. The method of claim 6, wherein the container is constructed with stainless steel or carbon steel.

18. The method of claim 6, wherein the organic solvent is select from the group consisting of methanol, ethanol, 1-propanol, isopropanol, monomethyl ether, propylene glycol monoethyl ether, propylene glycol monomethyl ether, propylene glycol monopropyl ether, propylene glycol monomethyl ether acetate, ethyl lactate, methyl methoxypropionate, cyclopentanone, cyclohexanone, γ-butyrolactone, diisoamyl ether, butyl acetate, 4-methyl-2-pentanol, and a combination thereof.

\* \* \* \* \*